(12) United States Patent
Kiehl et al.

(10) Patent No.: US 6,783,372 B2
(45) Date of Patent: Aug. 31, 2004

(54) APPARATUS FOR CONNECTING SEMICONDUCTOR MODULES

(75) Inventors: Oliver Kiehl, Charlotte, VT (US); Simon Muff, Höhenkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/345,057

(22) Filed: Jan. 15, 2003

(65) Prior Publication Data

US 2003/0157816 A1 Aug. 21, 2003

(30) Foreign Application Priority Data

Jan. 28, 2002 (DE) .......................................... 102 03 151

(51) Int. Cl.[7] .............................................. H01R 12/00
(52) U.S. Cl. .......................... 439/68; 326/101; 326/65
(58) Field of Search ...................... 439/68, 65; 326/101, 326/30, 40, 93; 257/697, 666, 692; 710/129, 128, 110; 365/233; 375/219

(56) References Cited

U.S. PATENT DOCUMENTS 5,770,950 A  6/1998 Zurcher et al.
6,114,751 A  9/2000 Kumakura et al.
6,125,419 A  9/2000 Umemura et al.
6,211,703 B1 4/2001 Takekuma et al.

FOREIGN PATENT DOCUMENTS

DE  197 23 876 A1  12/1997

*Primary Examiner*—Alex Gilman
(74) *Attorney, Agent, or Firm*—Fish & Richardson P.C.

(57) ABSTRACT

The present invention provides an apparatus for connecting semiconductor modules, in particular memory banks, having: at least two devices (A, B) for receiving a respective semiconductor module (1, 2); a contact device (13a, 13b, 13c, 13d, 13e, 13f) having a first group of contacts (13a, 13b, 13c, 13d) and a second group of contacts (13e, 13f), the two groups being able to be connected to one another by means of a variable connection module (3, 4); a group of lines (10, 11, 20, 21) for connecting the receiving devices (A, B) to the first group of contacts (13a, 13b, 13c, 13d), a subgroup (13b, 13c) of the first group of contacts being assigned to the lines (10, 11) of the first receiving device (A); the connection module (3, 4) connecting either a subgroup of the contacts (13b, 13c) to the second group of contacts (13e, 13f), or the first group of contacts (13a, 13b, 13c, 13d) to the second group of contacts (13e, 13f). The present invention likewise provides a method for connecting semiconductor modules, in particular memory banks.

23 Claims, 1 Drawing Sheet

APPARATUS FOR CONNECTING SEMICONDUCTOR MODULES

RELATED APPLICATIONS

This application claims the Jan. 28, 2002 priority date of German application 10203151.7, the contents of which are herein incorporated by reference.

FIELD OF INVENTION

The present invention relates to an apparatus for connecting semiconductor modules, in particular memory banks.

BACKGROUND

Printed circuit boards (PCBs), in particular for receiving memory modules, often have features which allow a plurality of population variants for different requirements. One example of such a population variant is a printed circuit board module which is provided with one or two memory banks.

In the case of present-day printed circuit boards or populations of printed circuit boards, the DRAM memory modules of a second bank that is optionally to be mounted are simply not mounted, an unterminated stub remaining which brings about undesirable reflections on the line and represents a small electrical dipole which radiates in an undesirable manner. A further customary embodiment consists in providing in each case a separate printed circuit board for application with one memory bank or two memory banks (DRAM memory module), which results in an increased outlay for the stock keeping and the development of two separate boards. A further possibility consists in linking the optionally required stubs for an optional second memory bank by means of zero-ohm resistors if a second bank (DRAM memory) is inserted on the printed circuit board, the additional zero-ohm resistors leading to complex layout structures on the printed circuit board, particularly if the branch junctions to the optional stubs lie below the DRAM memory modules.

FIG. 1 illustrates a customary arrangement for linking two semiconductor memory banks 1, 2, e.g. on a printed circuit board. By means of a printed circuit board connecting terminal 12 (etch [sic] connector), two bidirectional data lines 10, 11 are connected to soldering contacts 13b,c,e,f, which provides the contact-connection points for a resistor module 3 with two resistors (R2 pack). By means of a continuation of the two bidirectional data lines 10, 11, a memory bank 1 is linked by means of a layer 5 of the printed circuit board, a further memory bank 2 being linked by means of two vias 7 and consequently by means of a second layer 6 and stubs situated thereon. Consequently, the two memory banks 1, 2 or the receiving devices A, B thereof are connected to bidirectional data lines 110, 111 by means of common resistors of the resistor module 3 (R2 pack).

FIG. 2 shows the same arrangement as FIG. 1, but without the mounting of the second memory bank 2. In the absence of a second connected memory bank 2, two unterminated stubs 8 remain, to which the signal of the bidirectional data lines 10, 11 is nevertheless applied. As a result, undesirable reflections and thus signal corruptions can occur at the line ends, which reduces the signal quality of the data read in and out.

SUMMARY

It is an object of the present invention to provide an apparatus for connecting semiconductor modules, in particular memory banks, which ensures an improvement in the data quality in conjunction with a low outlay on circuitry.

The idea on which the present invention is based consists in using the same soldering contacts (soldering pads) for a connection module, e.g. with two and four resistors (2- and 4-R pack).

In the present invention, the problem mentioned in the introduction is solved in particular by virtue of the fact that the connection module connects contacts in such a way that only lines which lead to a connected semiconductor module are contact-connected in each case.

Advantageous developments and improvements of the respective subject matter of the invention can be found in the subclaims.

In accordance with one preferred development, a printed circuit board on which the apparatus is situated has at least two different printed circuit board layers by means of which the semiconductor modules, in particular memory banks, or devices for receiving the semiconductor banks or components are contact-connected.

In accordance with a further preferred development, the semiconductor modules comprise semiconductor memory elements, in particular (DRAM) memory banks.

In accordance with a further preferred development, the connection module has resistors.

In accordance with a further preferred development, the connection module has a separate resistor in each case per connected memory bank and data line.

In accordance with a further preferred development, the apparatus with two connected semiconductor modules, in particular memory banks, has a connection module with four resistors.

In accordance with a further preferred development, the apparatus with an individual connected semiconductor module has a connection module with two resistors.

In accordance with a further preferred development, the lines are data lines, in particular bidirectional data lines.

In accordance with a further preferred development, the contacts of the connection module are soldering contacts.

In accordance with a further preferred development, a group of contacts of the connection module are connected to a plug contact/printed circuit board connecting terminal (etch [sic] connector) by means of lines.

Exemplary embodiments of the invention are illustrated in the drawings and are explained in more detail in the description below.

BRIEF DESCRIPTION OF THE FIGURES

In the figures.

In the figures, identical reference symbols designate identical or functionally identical constituent parts.

DETAILED DESCRIPTION

Figure 1:
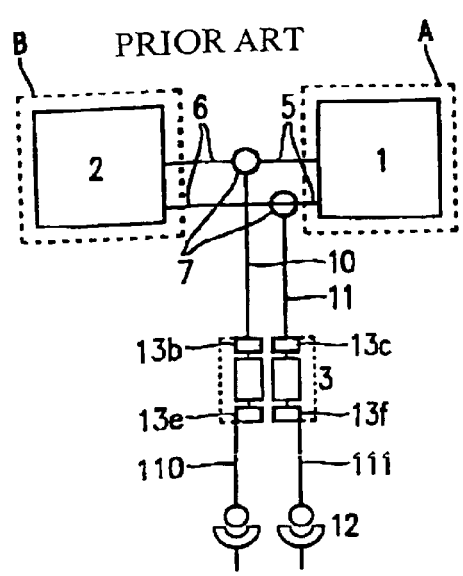
FIG. 1 shows the block diagram of a customary apparatus for connecting two semiconductor modules, in particular memory banks.
Figure 2:
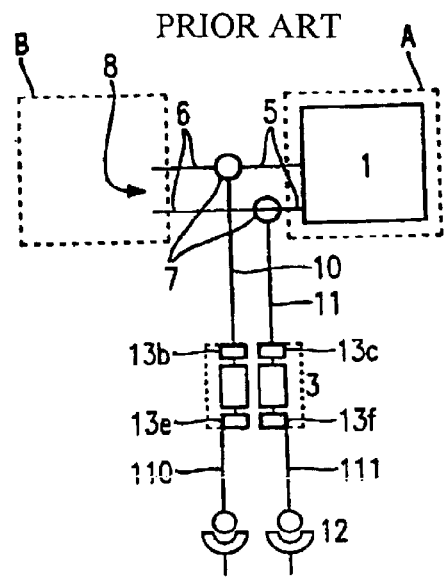
FIG. 2 shows the block diagram of a customary apparatus according to FIG. 1 with only one connected memory bank.
Figure 3:
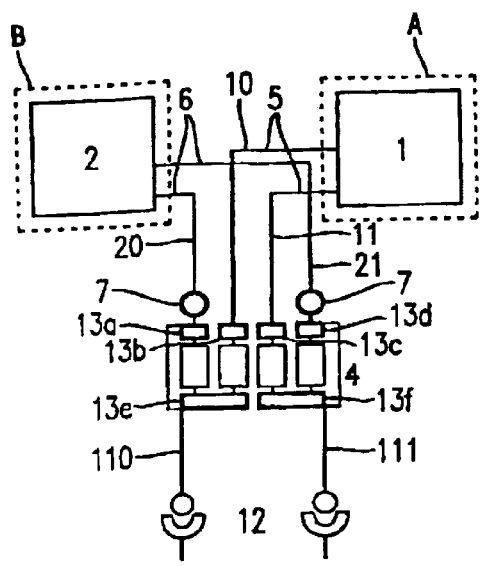
FIG. 3 shows the block diagram of an apparatus for connecting memory banks with two connected memory banks for elucidating an embodiment of the present invention.

FIG. 3 shows the block diagram of an apparatus for connecting memory banks with two connected memory banks for elucidating an embodiment of the present invention.

Figure 4:
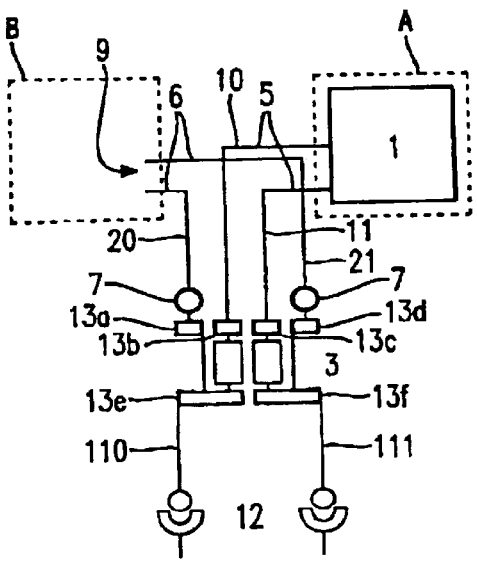
FIG. 4 shows the block diagram of the apparatus according to FIG. 3 with only one connected semiconductor module for elucidating an embodiment of the present invention.

FIG. 3 shows, in association with FIG. 4, an embodiment of the present invention with in each case one or two connected memory banks.

By means of two lines 110, 111, in particular (bidirectional) data lines, soldering contacts 13*e,f* are connected to a plug contact or a printed circuit board connecting terminal 12 (etch [sic] connector). A connection module 4 with four resistors (R4 pack) contact-connects the contacts 13*a–f*, which are connected to the plug contact 12 by means of the two bidirectional data lines 110, 111, to four bidirectional data lines (10, 11, 20, 21), which contact-connect the receiving devices a, B or the mounted memory banks 1, 2 in two different printed circuit board layers 5, 6 (layer 1, layer 2). By means of two vias 7, the two bidirectional data lines 20, 21 ($DQ_n$, $DQ_{n+1}$) are led into a layer 6—lying below the printed circuit board surface—to the memory bank 2 (DRAM bank 2).

FIG. 4 illustrates the block diagram of an apparatus according to FIG. 3 with only one connected memory bank for elucidating the embodiment according to FIG. 3 of the present invention. The block diagram illustrated in FIG. 4 differs from the block diagram according to FIG. 3 in particular by virtue of the fact that the apparatus has only one connected memory bank 1 (DRAM bank 1), and that a connection module 3 with only two resistors (R2 pack) is used, which connects only the bidirectional data lines 10, 11 of the first printed circuit board layer 5 (layer 1), by means of the soldering contacts 13*b,c*, to the contacts 13*e,f* or the data lines 110, 111, which are directly connected to the plug contact 12 (etch [sic] connector). Consequently, the data signal is not applied to the stubs 20, 21 in the layer 26 (layer 2) and said stubs, as disconnected stubs 9, thus have no reflections at their ends which might interfere with or corrupt the data signal.

Although the present invention has been described above using a preferred exemplary embodiment, it is not restricteid thereto, but rather can be modified in diverse ways.

In particular, the invention is not restricted to memory modules or banks, but rather can be used for connecting any semiconductor modules. Augmentation by additional memory modules is furthermore conceivable, which memory modules can also be contact-connected to additional resistors by means of additional lines and/or printed circuit board layers and corresponding connection modules of variable size.

Moreover, the invention is not restricted to the application possibilities mentioned.

What we claim as new, and secure by Letters Patent, is:

1. Apparatus for connecting semiconductor modules, the apparatus comprising:
   at least two receiving devices for receiving a respective semiconductor module;
   a contact device having a first group ox contacts and a second group of contacts, the first and second groups being able to be connected to one another by means of a variable connection module;
   a group of lines for connecting the receiving devices to the first group of contacts, a subgroup of the first group of contacts being assigned to the lines of the first receiving device;
   the connection module connecting either a subgroup of the contacts to the second group of contacts, or the first group of contacts to the second group of contacts.

2. Apparatus according to claim 1, wherein the receiving devices are contact-connected by lines in at least two different layers of a printed circuit board.

3. Apparatus according to claim 1, wherein the contacts of the contact device comprise soldering contacts.

4. Apparatus according to claim 1, wherein the second group of contacts is connected to a plug contact by lines.

5. Apparatus according to claim 1, wherein the semiconductor modules that can be inserted into the receiving device comprise semiconductor memory modules.

6. Apparatus of claim 5, wherein the semiconductor memory modules comprise DRAM memory banks.

7. Apparatus according to claim 1, wherein the lines comprise data lines.

8. Apparatus of claim 7, wherein the data lines comprise bidirectional data lines.

9. Apparatus according to claim 1, wherein the connection module comprises resistors.

10. Apparatus according to claim 9, wherein the connection module has precisely one resistor in each case per connected semiconductor module and line.

11. Apparatus according to claim 10, wherein the apparatus has two connected semiconductor modules with, in each case, two contact-connected lines and a connection module with four resistors.

12. Apparatus according to claim 10, wherein the apparatus comprises one connected semiconductor module with two contact connected lines and a connection module with two resistors.

13. Method for connecting semiconductor modules, the method comprising providing at least two receiving devices for a respective semiconductor module;
   providing a contact device having a first group of contacts and a second group of contacts, the first and second groups being able to be connected to one another by a variable connection module;
   providing a group of lines for connecting the receiving devices to the first group of contacts, a subgroup of the first group of contacts being assigned to the lines of the first receiving device;
   providing a first connection module for connecting a subgroup of the first group of contacts to the second group of contacts if a receiving device is populated; and
   providing a second connection module for connecting the first group of contacts to the second group of contacts if two receiving devices are populated.

14. An apparatus for connecting first and second semiconductor modules, the apparatus comprising:
   first and second receiving devices for receiving respective first and second semiconductor modules;
   a contact device having a first contact group and a second contact group, the first contact group having a first subgroup and a second subgroup;
   a first set of lines connecting the first subgroup to the first receiving device;
   a second set of lines connecting the second subgroup to the second receiving device;
   a variable connection module interposed between the first contact group and the second contact group, the connection module being configured
     to connect the first and second subgroups to the second contact group when both the first and second receiving devices are populated and to connect only the first subgroup to the second contact group when only the first receiving device is populated.

15. The apparatus of claim 14, wherein the first set of lines comprises two lines, the second set of lines comprises two lines, and the variable connection module comprises four resistors, each one of which corresponds to a line from one of the first and second sets of lines.

16. The apparatus of claim 14, wherein the first set of lines comprises first and second lines and the variable connection module comprises a first resistor connected to the first line and a second resistor connected to the second line.

17. An apparatus according to claim 14, wherein the first contact group comprises soldering contacts.

18. An apparatus according to claim 14, further comprising a line connecting a contact from the second contact group to a plug contact.

19. The apparatus of claim 14, wherein the variable connection module comprises a resistor interposed between the first contact group and the second contact group.

20. The apparatus of claim 19, wherein the variable connection module comprises one resistor per receiving device.

21. An apparatus according to claim 14, herein the first and second sets of lines comprise data lines.

22. An apparatus according to claim 21, wherein the first and second sets of lines comprise bidirectional data lines.

23. A method for connecting first and second semiconductor modules, the method comprising:

providing first and second receiving devices for receiving respective first and second semiconductor modules;

providing a contact device having a first contact group and a second contact group, the first contact group having a first subgroup and a second subgroup;

connecting the first subgroup to the first receiving device and the second subgroup to the second receiving device;

connecting the first and second subgroups to the second contact group when both the first and second receiving devices are populated; and connecting only the first subgroup to the second contact group when only the first receiving device is populated.

* * * * *